United States Patent [19]

Machida

[11] Patent Number: 5,079,504
[45] Date of Patent: Jan. 7, 1992

[54] MAGNETIC RESONANCE IMAGING SYSTEM

[75] Inventor: Yoshio Machida, Tochigi, Japan

[73] Assignee: Kabushiki Kaisha Toshiba, Kawasaki, Japan

[21] Appl. No.: 499,725

[22] Filed: Mar. 27, 1990

[30] Foreign Application Priority Data

Mar. 29, 1989 [JP] Japan ............................ 1-77034

[51] Int. Cl.$^5$ .................................... G01R 33/20
[52] U.S. Cl. .................................... 324/309
[58] Field of Search ............... 324/300, 307, 309, 310, 324/311, 312, 313, 314, 318, 322

[56] References Cited

U.S. PATENT DOCUMENTS

| | | | |
|---|---|---|---|
| 4,737,714 | 4/1988 | Hanawa | 324/309 |
| 4,803,432 | 2/1989 | Perman | 324/309 |
| 4,818,937 | 4/1989 | Ailion et al. | 324/309 |
| 4,855,679 | 8/1989 | Granot | 324/309 |
| 4,896,111 | 1/1990 | Machida et al. | 324/309 |

Primary Examiner—Michael J. Tokar
Attorney, Agent, or Firm—Foley & Lardner

[57] ABSTRACT

In a magnetic resonance imaging system for acquiring a magnetic resonance signal from a three-dimensional region to be imaged by executing a data acquisition pulse sequence based on a three-dimensional Fourier transform method including selective excitation, regions located on both sides of the three-dimensional region in a slice direction are presaturated prior to execution of the data acquisition pulse sequence based on the three-dimensional Fourier transform method including selective excitation, a region which includes the three-dimensional region and is broader than the three-dimensional region in the slice direction is then selectively excited, and the data acquisition pulse sequence based on the three-dimensional Fourier transform method is executed, thereby acquiring a magnetic resonance signal from the three-dimensional region.

14 Claims, 11 Drawing Sheets

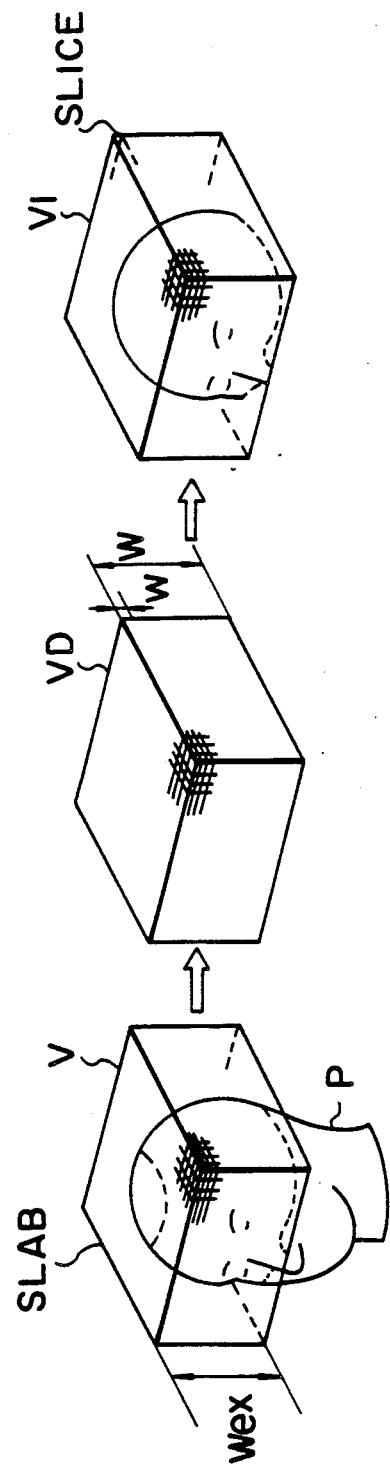

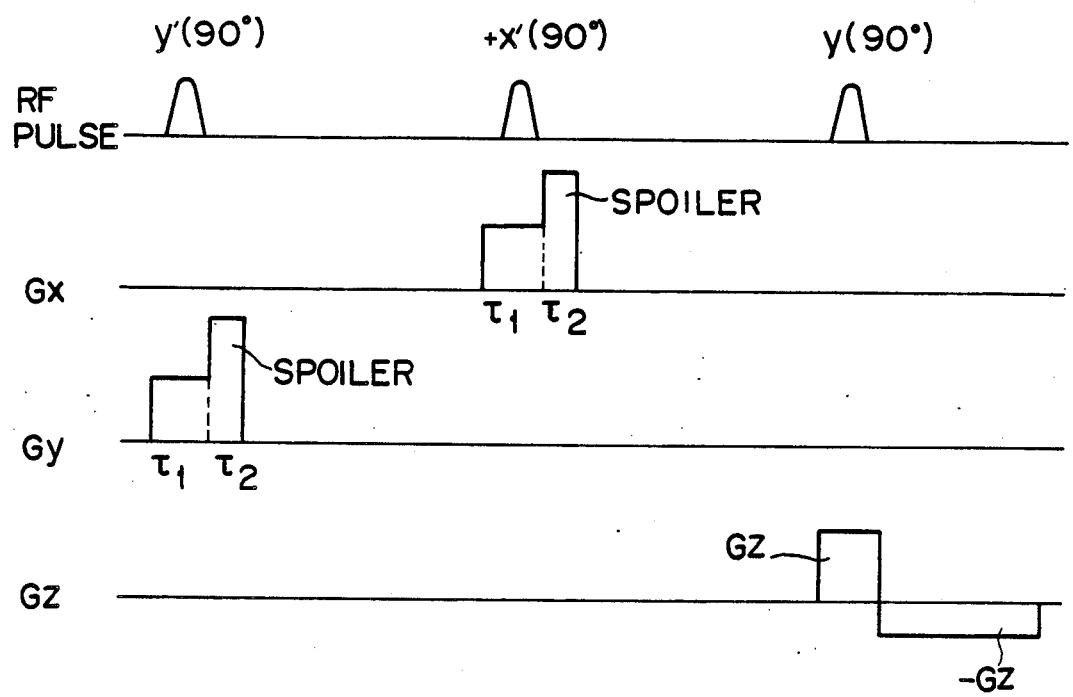
F I G. 10

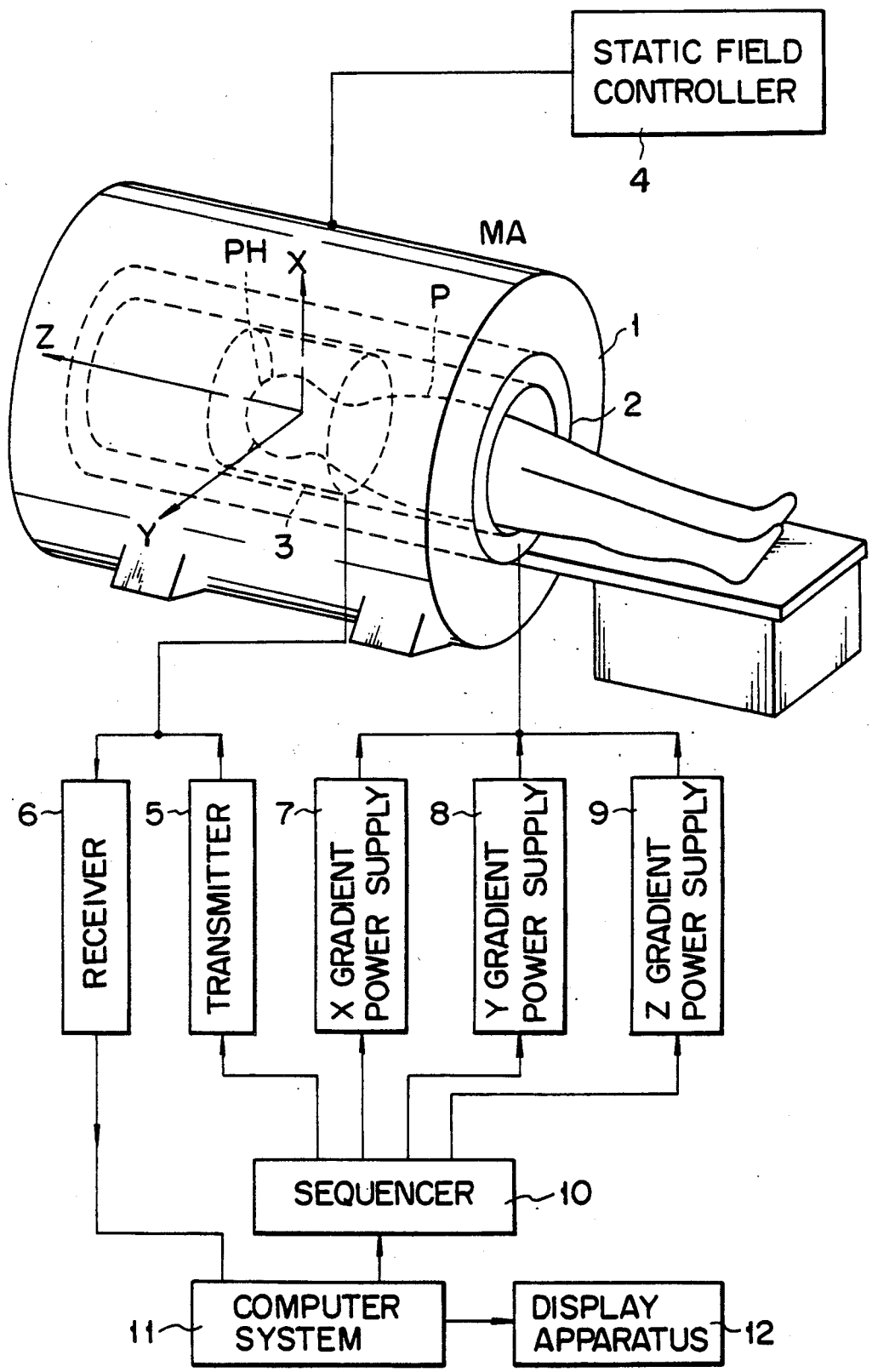
F I G. 14

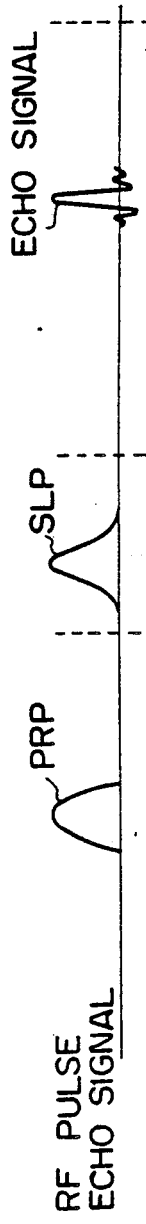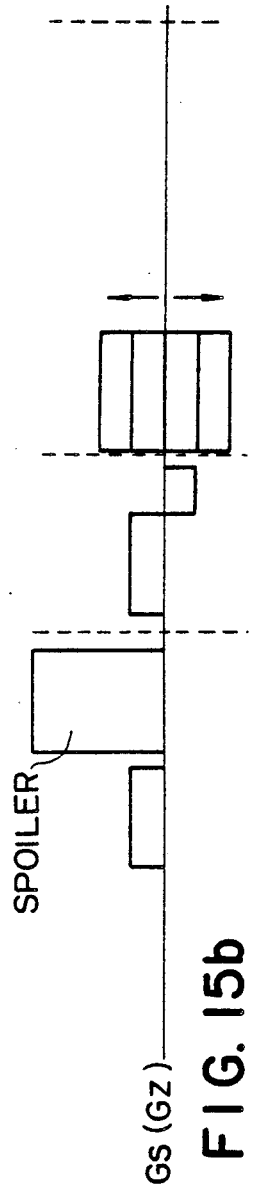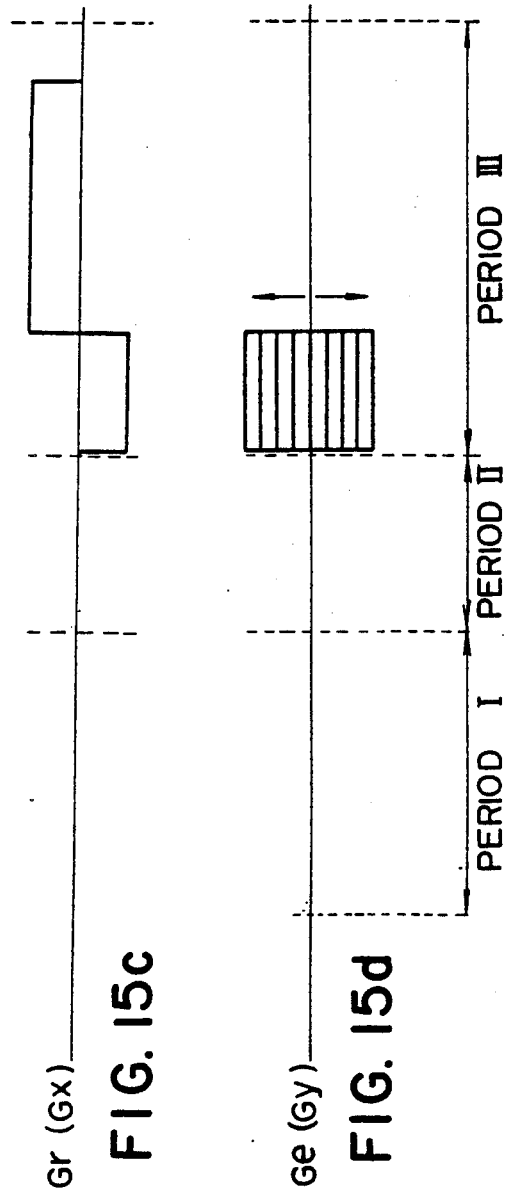

MAGNETIC RESONANCE IMAGING SYSTEM

BACKGROUND OF THE INVENTION

1. Field of the Invention

The present invention relates to a magnetic resonance imaging system for performing magnetic resonance imaging by a three-dimensional Fourier transform (3 DFT) method.

2. Description of the Related Art

Magnetic resonance (MR) phenomenon is a phenomenon in which a specific atomic nucleus which has a non-zero spin and a magnetic moment generated by the spin and is placed in a static field resonantly absorbs only an electromagnetic wave having a specific frequency. This atomic nucleus resonates at an angular frequency $\omega_0$ ($\omega_0 = 2\pi\gamma_0$; $\gamma_0$ is a Larmor frequency) represented by the following equation:

$$\omega_0 = \gamma H_0$$

where $\gamma$ is a gyromagnetic ratio unique to the type of an atomic nucleus, and $H_0$ is a static field intensity.

In a magnetic resonance apparatus for examining and diagnosing a living body by using the MR phenomenon, an MR signal (e.g., an MR echo signal or an FID (free induction decay) signal), which is an electromagnetic wave having a frequency equivalent to the specific frequency induced by the above magnetic absorption, is detected and is subjected to signal processing, thereby obtaining diagnostic data (e.g., a slice image of a patient) reflecting an atomic nucleus density, a longitudinal relaxation time $T_1$, a transverse relaxation time $T_2$, the flow of a body fluid (e.g., a blood), and chemical shift data. Such an apparatus allows noninvasive acquisition of various data in an object to be examined, and hence is very effective for medical diagnosis.

In acquisition of diagnostic data by MR, MR can be theoretically excited at the entire portion of an object to be examined which is placed in a static field so as to acquire signals generated by the MR. In a practical apparatus, however, MR excitation and signal acquisition are performed with respect to a specific portion due to limitations on the arrangement of the apparatus or clinical requirements for diagnosis images.

As a typical example of such a magnetic resonance apparatus' a magnetic resonance imaging (MRI) system which is mainly designed for acquisition of MR image data, i.e., distribution data of the above-described various MR data is known.

The MRI system mainly comprises: a static field coil system for generating a homogeneous static magnetic field in an imaging region in which an object to be examined is to be placed; a gradient field coil system for generating gradient fields whose intensities are gradually and linearly changed in predetermined directions in the imaging region; a probe including a transmission/reception coil system for transmitting a high-frequency rotating magnetic field (high-frequency pulse) to the imaging region, and detecting an MR signal (e.g., an MR echo signal) induced by MR; a static field control system for performing energization control of the static field coil system; a transmitter and a receiver for respectively transmitting a high-frequency field and receiving an MR signal through the probe; X, Y, and Z gradient power supplies for respectively causing said gradient field coil system to generate gradient fields in orthogonal X-, Y-, and Z-axis directions; a sequencer for controlling the transmitter, the X, Y, and Z gradient power supplies in accordance with an image data acquisition sequence based on a predetermined imaging method such as a Fourier transform method; a computer system for controlling the sequencer and performing signal processing of an MR signal detected by the receiver; and a display apparatus for displaying data obtained by the signal processing as an image.

Imaging is performed in the following procedure. An object to be examined is placed in the imaging region. While a static field is generated in the imaging region by the static field control system and the static field coil system, the sequencer is operated, and a predetermined pulse sequence, e.g., a pulse sequence based on a spin-echo method, for acquiring MR data necessary for imaging is executed.

In accordance with the pulse sequence, the transmitter is driven to cause a coil system of the probe to apply a pulse-like high-frequency rotating magnetic field, i.e., a high-frequency pulse (typically, a selective excitation pulse or nonselective excitation pulse having a flip angle of 90° and/or 180°) to the object in the imaging region, and the X, Y, and Z gradient power supplies are driven to cause the gradient field coil system to apply X, Y, and Z gradient fields Gx, Gy, and Gz to the object in the imaging region as a slice gradient field (Gs), an encode gradient field (Ge), and a readout gradient field (Gr), respectively. MR is excited at a slice portion having a thickness determined by the selective excitation pulse and the slice gradient field which is applied while the selective excitation pulse is applied to the object. An MR signal from the slice portion is then acquired by the coils of the probe, and data corresponding to one line in an image region in a Fourier space is obtained. In order to generate MR signals corresponding to one frame, such a sequence is normally repeated a predetermined number of times to obtain MR data. MR data obtained in each sequence is subjected to reconstruction processing to generate and display, e.g., a two-dimensional MR image.

The above-description is associated with imaging based on the two-dimensional transform method. In addition to the two-dimensional Fourier transform method, a three-dimensional transform method used for construction of a three-dimensional image is available as an imaging method.

Imaging based on a known three-dimensional transform method including selective excitation will be described below with reference to FIGS. 1 and 2A to 2C.

FIG. 1 shows a pulse sequence of the three-dimensional transform method including selective excitation in which a gradient field echo method is employed as a method of generating MR echoes. FIG. 2A shows a selective excitation region V as an object to be imaged in order to explain excitation processing. FIG. 2B shows an acquired data group, i.e., three-dimensional volume data VD in order to explain data acquisition processing. FIG. 2C shows a three-dimensional image VI obtained by performing reconstruction processing of the three-dimensional data VD by the three-dimensional Fourier transform method in order to explain reconstruction processing.

In a period I shown in FIG. 1, while, a slice gradient field Gs, e.g., a gradient field Gz in the Z-axis direction is applied to an object P to be examined, which is placed in an imaging region, in the form of a pulse, a selective excitation pulse as an RF (radio frequency) is applied to the object P. A selective excitation region V of the object P is excited by the selective excitation pulse and the slice gradient field Gs, and MR occurs at the region V. The selective excitation region V has a size Wex determined in the slice direction, i.e., the Z direction by the selective excitation pulse and the slice gradient field Gs. The selective excitation region is called a slab. The slab consists of a plurality of slices. That is, a slice region based on the RF pulse and the slice gradient field Gs is called a "slab". This slab is decomposed into a plurality of slice regions by reconstruction processing. Each slice region is called a "slice". (It is apparent that application of the slice gradient field Gs includes inverse application for compensation.)

Subsequently, in a period II shown in FIG. 1, a slice gradient field Gs (e.g., a Z-axis gradient field Gz) and an encode gradient field Ge (e.g., a Y-axis gradient field Gy) for encoding a phase in two directions, and a readout gradient field Gr (e.g., an X-axis gradient field Gx) for generation of echoes are applied in the form of a pulse. The polarities of the read gradient field Gr (X-axis gradient field Gx) are then reversed and the field Gr is applied in the form of a pulse having the opposite polarity. During this application period, an MR echo signal is acquired. The MR echo signal induced by the inversion of the read gradient field Gr (X-axis gradient field Gx) is encoded by the slice gradient field Gs (X-axis gradient field Gz) in the slice direction (Z-axis direction) and is also encoded by the encode gradient field Ge (Y-axis gradient field Gy) in the encode direction (Y-axis direction). As a result, position data of the MR echo signal in the respective directions are phase-encoded. The three-dimensional data DV (corresponding to the slab) shown in FIG. 2B can be obtained by repeating the above-described sequence a number of times corresponding to the matrix size of MR image data to be reconstructed while sequentially changing the intensity of each gradient field for each encoding.

A slice thickness (or slice depth) w is determined by the degree of encoding in the slice direction. A slice count N is determined by the number of times of encoding in the slice direction. That is, the relationship between a slab thickness (or slab depth) W and slices can be represented by W=N·w.

Note that the thickness of an actual excitation region determined by the intensities of a selective excitation pulse and the slice gradient field Gs superposed thereon is called a slab excitation thickness Wex.

Selective excitation characteristics will now be considered. Selective excitation characteristics (i.e., slice characteristics) are equivalent to distribution characteristics of MR signal levels in relation to displacement of a gradient field applied together with an selective excitation pulse. Ideally, a perfect rectangular characteristic curve (i.e., characteristics in which, in the slice direction, MR signal levels outside a slab are zero, MR signal levels at boundaries of the slab steeply rise, and MR signals having a uniform level are obtained within the slab) is obtained. Actual selective excitation characteristics, however, do not exhibit a perfect rectangular shape. Therefore, the slab excitation width Wex is generally defined by a half width in a curve obtained by respectively plotting displacement and signal levels on the abscissa and the ordinate, as shown in FIG. 3 (showing selective excitation characteristics commonly obtained by the spin-echo method).

As described above, since imperfect selective excitation characteristics are obtained, the following problems are posed in MRI by the conventional three-dimensional Fourier transform method including selective excitation.

If an ideal (rectangular) selective excitation characteristic curve is obtained, N slice images can be obtained by setting the slab excitation thickness Wex=slab thickness W, as shown in FIG. 4. In practice, however, ideal selective characteristics cannot be obtained as described above, the signal levels of the end slices of the slab V are lowered as shown in FIG. 5. Hence, a good image cannot be obtained. In addition, as indicated by dotted lines in FIG. 5, the MR signals at both the ends of the slab excitation thickness Wex involve signals from other end portions due to the influences of aliasing. As a result, at both ends of an image of the slab V shown in FIG. 6A, artifacts (indicated by dotted lines) based on the data of other ends are produced, as shown in FIG. 6A and 6B.

The above-described phenomenon occurs even in the spin-echo (SE) method in which dispersed spin phases are focused by a nonselective excitation pulse (typically, a 90°-180° pulse train is used), and in the gradient field echo (FE) method in which spin phases are focused by inverting a readout gradient field instead of the application of a nonselective excitation pulse, and the MR data acquisition time can be shortened by a time required for the application of a nonselective excitation pulse. Especially, in the FE method, the above phenomenon is further complicated due to the following reasons.

In the FE method, scan parameters are a pulse repetition time $T_R$, an echo time $T_E$, and a flip angle $\alpha$. In this case, a three-dimensional Fourier transform method (including selective excitation) to which the FE method is applied will be described.

If the pulse repetition time $T_R$ is fixed, and the flip angle $\alpha$ is changed, an obtained signal intensity is changed as shown in FIG. 7.

A signal intensity S is represented as follows:

$$S \propto H_0 \frac{(1 - e^{-\frac{T_R}{T_1}}) \cdot \sin\alpha}{1 - \cos\alpha \cdot e^{-\frac{T_R}{T_1}}}$$

A flip angle $\alpha_O$ at the maximum signal intensity (normally called an Ernst angle) can be represented as follows:

$$\alpha_0 = \cos^{-1}(e^{-\frac{T_R}{T_1}})$$

The flip angles $\alpha$ at both the ends of a selectively excited region, i.e., a slab become smaller than a set value due to incomplete selective excitation characteristics. Therefore, if $T_R >> 0$, $\alpha_0 \approx \pi/2$ (=90°). The obtained selective excitation characteristics are relatively close to the ideal rectangular shape, as shown in FIG. 8.

If, however, $T_R$ becomes smaller (shortened), $\alpha_O$ is reduced. In this case, if $\alpha < \alpha_O$ as shown in FIG. 9A, both the end portions of the curve, whose signal levels are not flat, are broadened. If $\alpha \approx \alpha_O$ as shown in FIG. 9B, the central flat portion is widened. If $\alpha > \alpha_O$ as shown in FIG. 9C, the signal levels of both the end portions are increased in signal level as compared with the central flat portion.

SUMMARY OF THE INVENTION

As described above, in the conventional systems, since MR is excited at a three-dimensional region as an object to be images by using a selective excitation pulse which cannot exhibit ideal characteristics, signal intensity errors and/or contrast errors (e.g., nonuniformity on an image) are caused in a final image of a slice in a slab due to the imperfection of the selective excitation processing. An image having such errors is not suitable for diagnosis. That is, images having desired signal intensities and contrast can be obtained only from limited portions near the center of a selective excitation region. Therefore, the number of slices which can be used as diagnostic images (effective slices) is decreased. In contrast to this, in order to increase the number of effective slices, a reconstruction matrix in the slice direction must be increased in size. Therefore, the number of steps of encoding in the slice direction must be increased. This prolongs the scan time for MR signal acquisition.

It is, therefore, an object of the present invention to provide an MRI system which allows an increase in the number of effective slices without prolonging the scan time for MR signal acquisition.

According to the present invention, there is provided a system, in which when a magnetic resonance signal from a three-dimensional region to be imaged is to be acquired by executing a data acquisition pulse sequence based on a three-dimensional Fourier transform method including selective excitation, regions located on both sides of the three-dimensional region in a slice direction are selectively presaturated prior to execution of the data acquisition pulse sequence based on the three-dimensional Fourier transform method including selective excitation, a region which includes the three-dimensional region and is broader than the three-dimensional region in the slice direction is then selectively excited, and the data acquisition pulse sequence based on the three-dimensional Fourier transform method is executed, thereby acquiring a magnetic resonance signal from the three-dimensional region.

In the above system, selective excitation of the region which includes the three-dimensional region to be imaged and is broader than it in the slice direction is preferably performed by reducing the intensity of a slice gradient field but not by changing the waveform of a selective excitation pulse.

Alternatively, in the above system, selective excitation of the region which includes the three-dimensional region to be imaged and is broader than it in the slice direction may be performed by compressing the envelope waveform of a selective excitation pulse in the width direction and increasing its amplitude but not by changing the intensity of a slice gradient field.

In the present invention, regions located on both the sides of a desired three-dimensional region to be imaged are selectively saturated by presaturation in advance, and the saturated regions are set in a state equivalent to a state wherein macro magnetization causing magnetic resonance does not substantially exist. By performing selective excitation of a region which includes the desired three-dimensional region and is broader than it in the slice direction, magnetic resonance is satisfactorily and ideally excited at only the desired three-dimensional region, and a signal from the region can be acquired. Therefore, a large number of effective slice images can be obtained from the desired three-dimensional region without increasing the scan time for magnetic resonance acquisition.

Moreover, selective excitation of the region which includes the desired three-dimensional region and is broader than it in the slice direction can be effectively realized by compressing the envelope waveform of the selective excitation pulse in the width direction and increasing its amplitude or reducing the intensity of the slice gradient field.

If the region which is broader than the three-dimensional region in the slice direction is selectively excited by compressing the envelope waveform of the selective excitation pulse in the widthwise direction and increasing its amplitude without changing the intensity of the slice gradient field, the echo time $T_E$ can be shortened, and hence the scan time can be shortened.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIGS. 2A, 2B, and 2C are views for explaining data acquisition in the system in FIG. 1;

FIG. 10 is a timing chart showing a pulse sequence of a local excitation method in the conventional system;

FIG. 14 is a block diagram showing an arrangement of an MRI system according to an embodiment of the present invention;

FIG. 15 is a timing chart showing a pulse sequence of MRI of a three-dimensional Fourier transform method including selective excitation in the system in FIG. 14;

DETAILED DESCRIPTION OF THE PREFERRED EMBODIMENT

Prior to a description of an embodiment of the present invention, a selective saturation method used in the embodiment of the present invention will be described below. In this method, transverse magnetization components are eliminated by a spoiler gradient field. This method is called a saturation method, i.e., a local excitation method, which is disclosed in U.S. Pat. No. 4,737,714. The gist of this method will be described below.

In the local excitation method, regions outside a desired local portion are substantially magnetically invalidated by applying a gradient field in a specific form, and MR signals from only the local portion are used for imaging. In this method, it is assumed that an object is present at only a local portion in acquisition of MR signals.

Figure 1A:
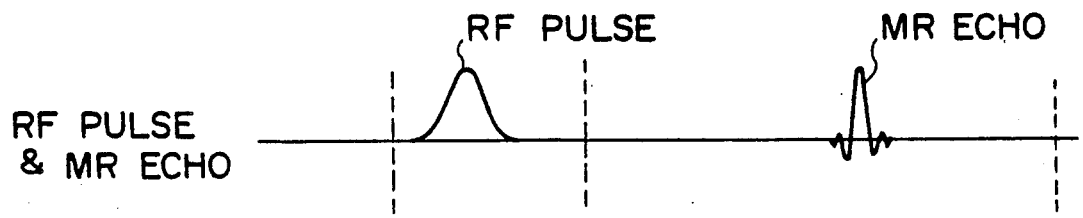
FIG. 1 is a timing chart showing a pulse sequence of a three-dimensional Fourier transform method including selective excitation in a conventional system.
Figure 1B:
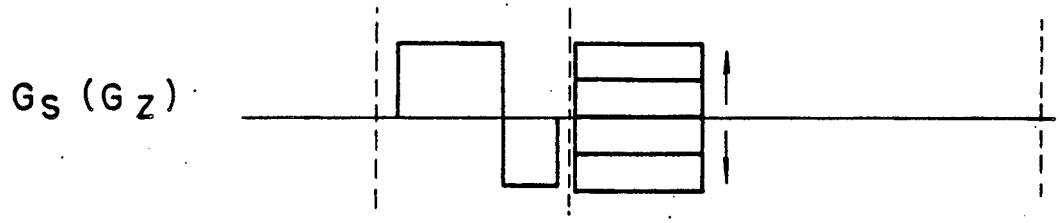
Figure 1C:
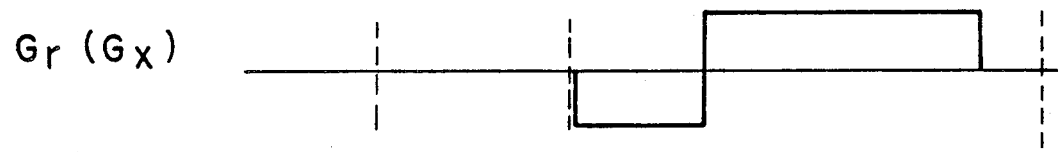
Figure 1D:
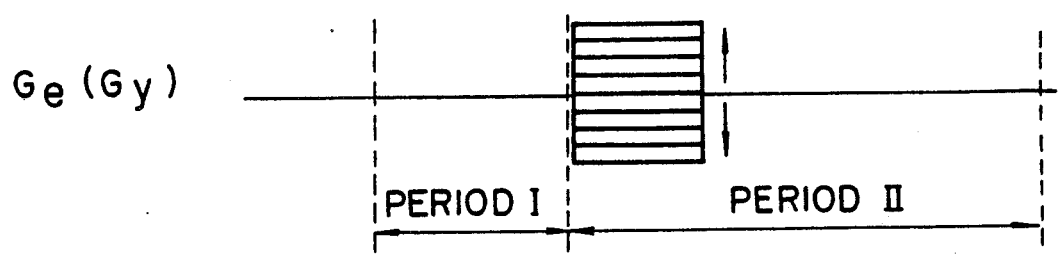
Figure 3:
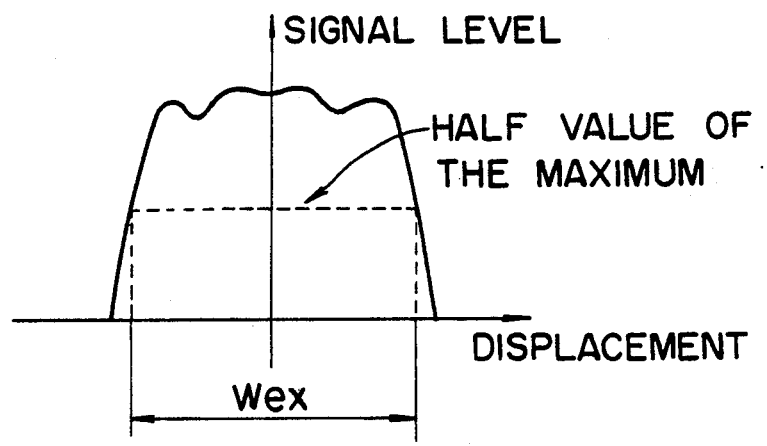
FIG. 3 is a graph for explaining selective excitation characteristics in the conventional system.
Figure 4:
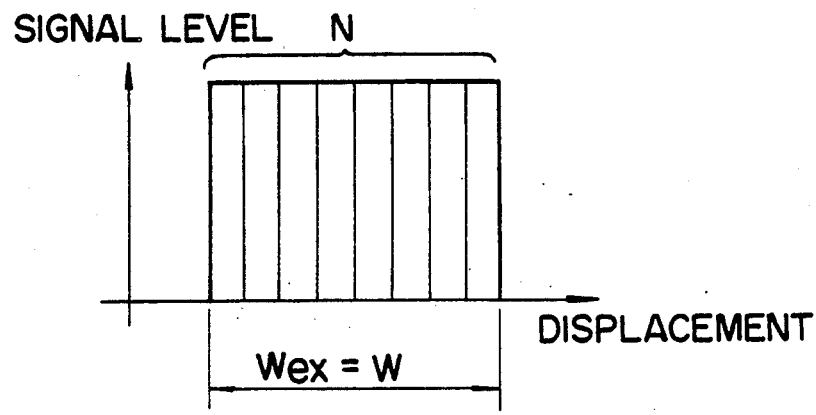
FIG. 4 is a graph for explaining the number of slices when ideal selective excitation characteristics are obtained.
Figure 5:
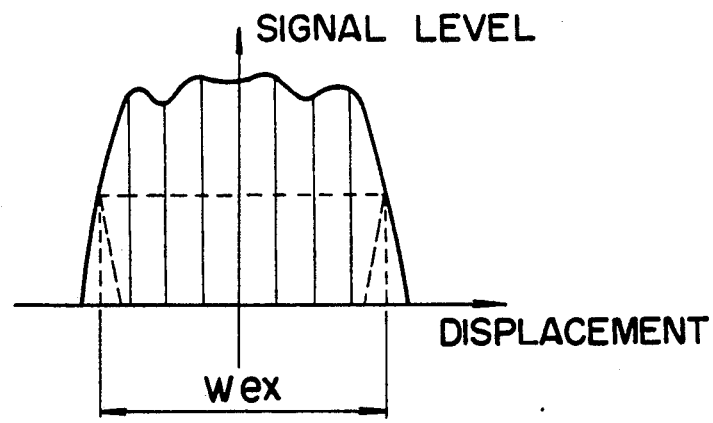
FIG. 5 is a graph for explaining problems posed when ideal selective excitation characteristics are not obtained.
Figures 6A, 6B, 6C:
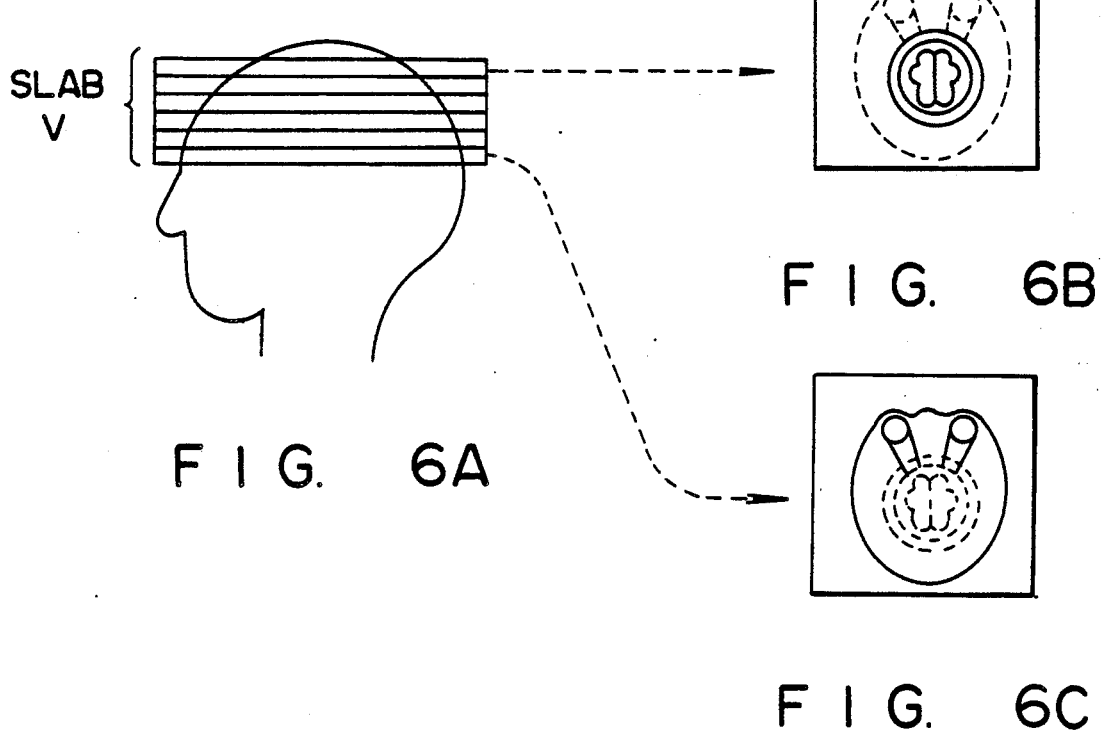
FIGS. 6A, 6B, and 6C are views for explaining a case wherein aliasing occurs because ideal selective excitation characteristics are not obtained.
Figure 7:
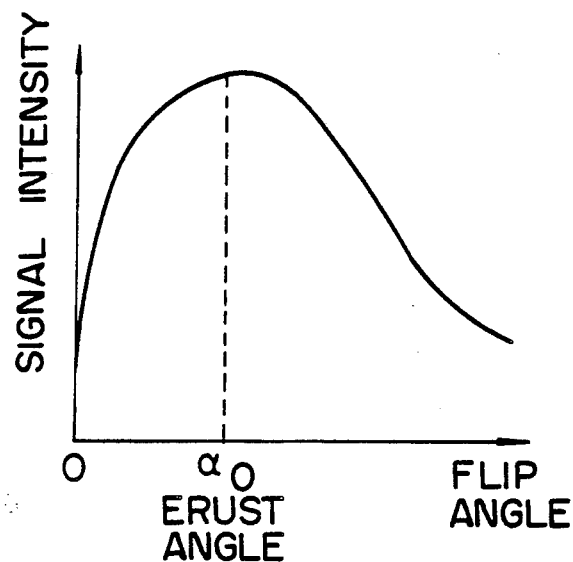
FIG. 7 is a graph showing a relationship between flip angles and signal levels.
Figure 8:
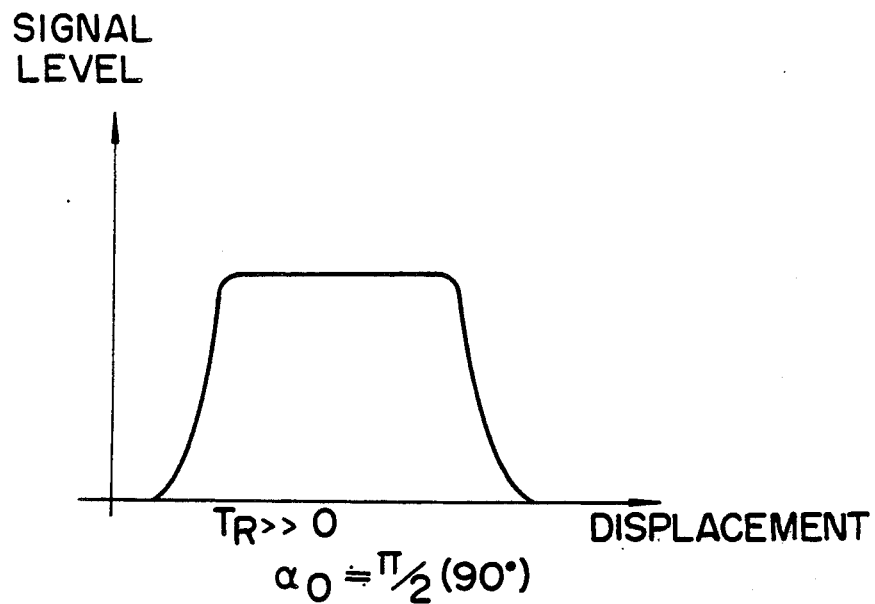
FIG. 8 and FIGS. 9A, 9B, and 9C are graphs each showing a relationship between flip angles and selective excitation characteristics.
Figure 9A:
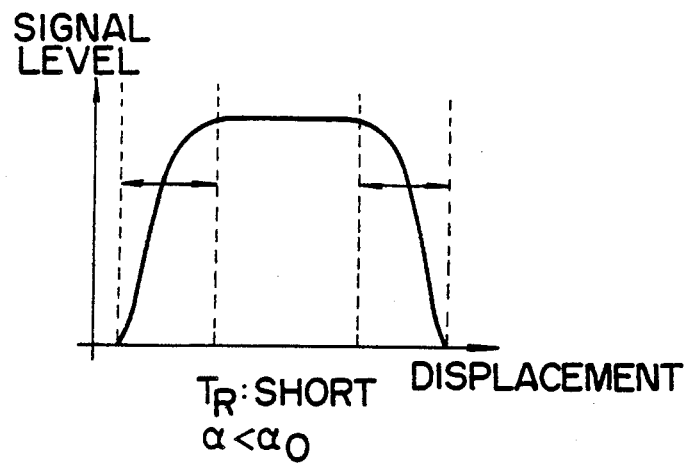
Figure 9B:
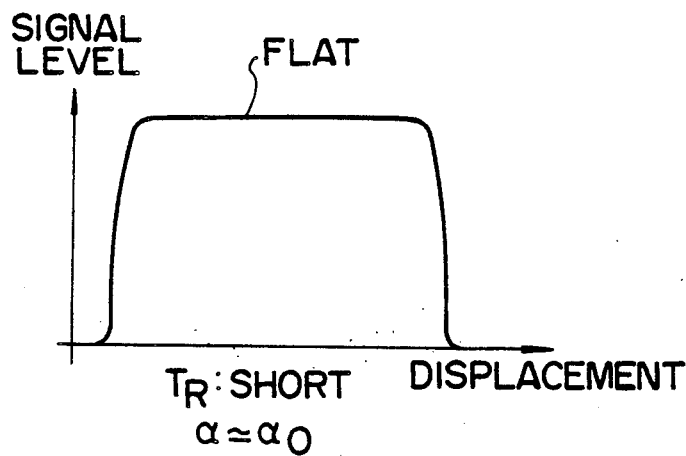
Figure 9C:
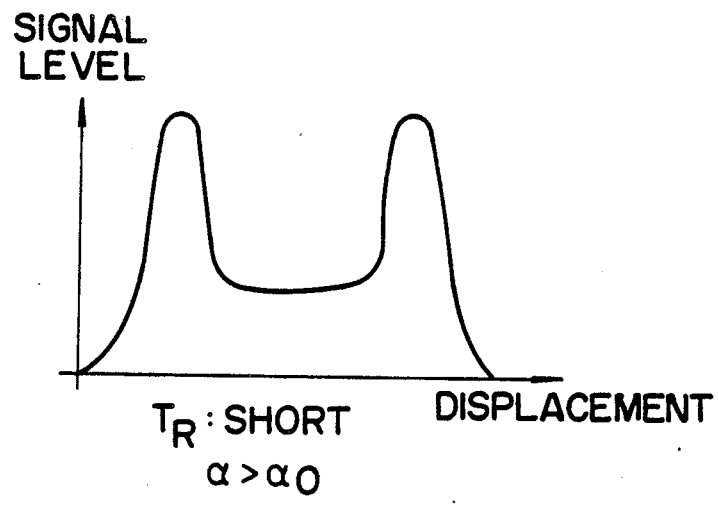
Figure 11:
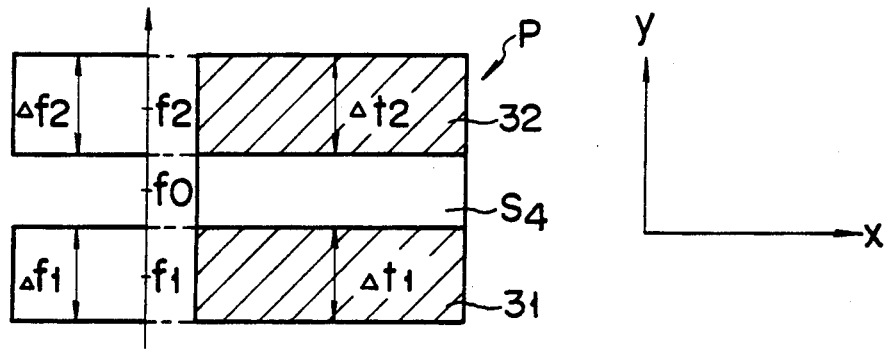
FIGS. 11 to 13 are views for explaining a function of the system in FIG. 10.
Figure 12:
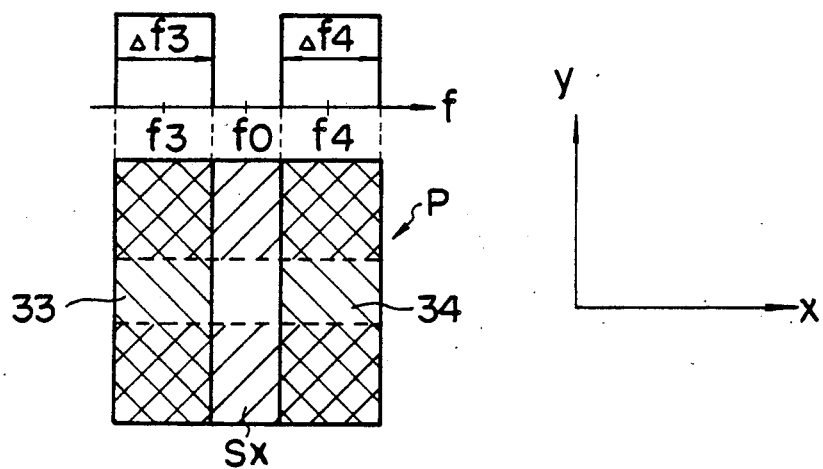
Figure 13:
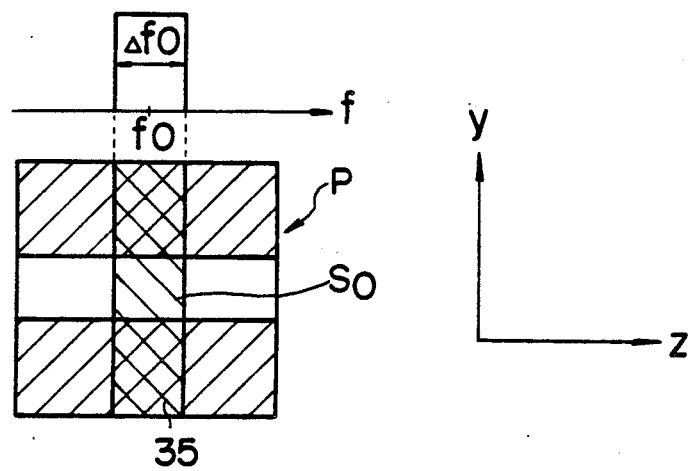

FIG. 10 shows a pulse sequence of the local excitation method. FIGS. 11 to 13 are views for explaining a function of the method.

In order to obtain a slice image at a specific portion of an object to be examined, e.g., a patient, a static field $H_O$ is generated in the Z-axis direction, and the object is placed in the static field $H_O$. Normally, the body axis of the object is made to coincide with the Z-axis direction. Magnetization in the object is oriented by the static field $H_O$ in the Z-axis direction. A signal for specifying the direction of the magnetization and a slice position is applied. Note that an X'-Y'-Z' coordinate system is a rotating coordinate system having the Z axis of an X-Y-Z coordinate system as an axis. In order to rotated the magnetization through 90° in a −X' direction, an RF pulse consisting of a 90° selective excitation pulse is applied to the object in a Y' direction. At the same time, a gradient field Gy is applied to the object in the Y direction. In this case, the 90° selective excitation pulse includes carriers $f_1$ and $f_2$ having different frequencies. That is, in FIGS. 10 and 11, if the center of a specific frequency for exciting a region Sy including a specific portion is a frequency $f_0$, an RF pulse including two frequencies $f_1$ and $f_2$ for exciting regions 31 and 32 (upper and lower hatched portions in FIG. 11) located on both the sides of the frequency $f_0$ may be used. In this case, both the frequencies $f_1$ and $f_2$ are center frequencies, and the widths of regions to be excited are determined by frequency bands $\Delta f_1$ and $\Delta f_2$ of the respective carriers. It is apparent from the following equations that a desired region can be selected by using carriers having different frequencies in the above described manner:

$$\omega_O = \gamma H_O$$

$$f_0 = (\gamma/2\pi) \cdot H_O$$

In addition, the gradient field Gy is applied in such a manner that a gradient field having a normal intensity for selective excitation of the regions 31 and 32 is applied to the object for a predetermined period $\tau_1$, and the gradient field is abruptly increased in intensity (amplitude) upon completion of the selective excitation, and is applied to the object for a predetermined period $\tau_2$. The latter gradient field whose intensity is increased is called a spoiler (spoiler pulse). Upon application of this spoiler, transverse magnetization components of the selectively excited portion are dispersed, and transverse components of macro magnetization are eliminated, i.e., saturated. To substantially eliminate magnetization of a selectively excited portion is called selective saturation.

Slice thicknesses $\tau_1$ and $\tau_2$ of the regions 31 and 32 in the Y direction are given by the following equations:

$$\Delta t_1 = \Delta f_1 / \gamma \cdot Gy$$

$$\Delta t_2 = \Delta f_2 / \gamma \cdot Gy$$

Excitation of left and right regions 33 and 34 in FIG. 12 based on the same principle as described above will be described below. Referring to FIGS. 10 and 12, in order to rotate magnetization through 90° in the Y' direction, an RF pulse consisting of 90° selective excitation pulse is applied to the object in the X' direction. At the same time, a gradient field Gx is applied. In this case, similar to the above-described operation, an RF pulse including two different frequencies $f_3$ and $f_4$ (frequency bands $\Delta t_3$ and $\Delta t_4$) located on both sides of a center frequency $f_0$ for exciting a region Sx including a target portion is used, and the gradient field Gx is set to have an intensity of a normal slice gradient field for a first period $\tau_1$ and to have a large intensity, as a spoiler, for a subsequent period $\tau_2$. Therefore, the magnetization of the regions 33 and 34, in which MR is excited once, is finally saturated and eliminated.

Finally, as shown in FIGS. 10 and 13, a 90° selective excitation RF pulse including a center frequency $f_0$ (frequency band $\Delta f_0$) is applied after a predetermined period of time so as to excite a central region 35, and a gradient field Gz is applied. By applying an echo refocus gradient field −Gz after the above operation, an MR echo signal can be generated. At this time, since magnetization of other regions has been eliminated by selective saturation as described above, the state of the outside of the local portion $S_0$ is equivalent to a state wherein substantially no magnetization is present. Therefore, signals from only the local portion $S_0$ can be acquired.

Only the local portion $S_0$ is excited in the above-described sequence, and imaging by a normal two-dimensional Fourier transform method or by a three-dimensional Fourier transform method can be performed by using MR echo signals obtained by the excitation.

A method of selectively saturating portions other than a desired portion in advance as described above is called presaturation. In the present invention, the presaturation is executed in accordance with the FE method prior to the execution of the major sequence of the three-dimensional Fourier transform method including selective excitation. The present invention is especially characterized in a relationship in setting between a three-dimensional region to be imaged, a presaturation region, and a selective excitation region.

FIG. 14 shows a schematic arrangement of an overall MRI system according to an embodiment of the present invention.

As shown in FIG. 14, a hollow portion is formed in a magnet assembly MA so as to accommodate an object P to be examined. The magnet assembly MA includes a normal conductive or superconductive static field coil system (to which a shim coil for correcting a static field is sometimes attached) 1, a gradient coil system 2 for generating gradient fields, and a probe 3 constituted by a coil system for transmitting a high-frequency pulse (RF pulse) and detecting an MR signal, e.g., an MR echo signal.

A static field controller 4 includes a coolant supply control system for a coil cooling system if the static field coil system is constituted by a superconductive type coil. The controller 4 mainly performs energization control of a static field power source. A transmitter 5 transmits a high-frequency field and a receiver 6 receives an MR signal through the probe 3. X, Y, and Z gradient power supplies 7, 8, and 9 cause the gradient field coil system 2 to generate gradient fields in orthogonal X-, Y-, and Z-axis directions, respectively. A sequencer 10 controls the transmitter 5, the X, Y, and Z gradient power supplies 7, 8, and 9 in accordance with an image data acquisition sequence based on a predetermined imaging method such as a Fourier transform method. A computer system 11 controls the sequencer 10 and performs signal processing of an MR signal detected by the receiver 6. A display apparatus 12 displays data obtained by the signal processing as an image.

The receiver 6 comprises a front amplifier for amplifying a reception signal from the coil system of the normal probe 3 to a value enough to be applied to subsequent processing, a phase sensitive detector for detecting real and imaginary parts of an output from the front amplifier by, e.g., quadrature detection, an A/D (analog-to-digital) converter for converting an output from the phase sensitive detector into a digital signal, and an interface for connecting the output of the A/D converter to the computer system 11.

The computer system 11 comprises a system controller for controlling the overall system through a data bus, a storage unit for storing data from the interface and holding the data for subsequent reconstruction processing and the like, a reconstructing unit for reading out data from the storage unit and performing Fourier transform of the readout data so as to form a scanoimage, a two-dimensional image, or a three-dimensional image, and a computer including a console serving as a man-machine interface for a system operation, image filing, a display operation, and the like, a display unit, and a filing unit for image filing.

With the above-described arrangement, in an imaging sequence, the object P is placed in a static field, and the sequencer 10 is operated to execute a pulse sequence for image data acquisition.

FIG. 15 shows a pulse sequence in the embodiment of the present invention. As shown in FIG. 14, in a period I, presaturation of both the side portions of a three-dimensional region (slab) to be imaged is performed in the slice direction by using a presaturation selective excitation pulse PRP (e.g., a Z-axis gradient field $G_z$) including a spoiler pulse. In this case, the presaturation selective excitation pulse PRP includes frequency components corresponding to the both side regions of the three-dimensional region in the slice direction.

In the next period II, a region which includes the three-dimensional region to be imaged and is broader than it is selectively excited in the slice direction by a slab selective excitation pulse SLP (having a flip angle of about 90°) and a slice gradient field Gs (e.g., a Z gradient field $G_z$). In this case, since the region which includes the three-dimensional region to be imaged and is broader than it is selectively excited in the slice direction, the intensity of the slice gradient field Gs is set to be, e.g., ½ that in FIG. 1. (It is apparent that the application of the slice gradient field Gs includes inverse application for compensation.)

In the next period III, MR signals are acquired from only the three-dimensional region to be imaged by executing the data acquisition pulse sequence based on the three-dimensional Fourier transform method corresponding to the matrix arrangement of reconstruction Image data. More specifically, the slice gradient field Gs (e.g., the Z-axis gradient field $G_z$) and the encode gradient field Ge (e.g., the Y-axis gradient field $G_y$) for encoding a phase in two directions and the readout gradient field Gr (e.g. the x-axis gradient field $G_x$) for obtaining echoes are applied in the form of a pulse, and the polarities of the readout gradient field Gr (e.g., the X-axis gradient field $G_x$) are subsequently reversed and the field Gr is applied in the form of a pulse, thus acquiring an MR echo signal during this application period. The position data of the MR echo signal induced by the inversion of the readout gradient field Gr (the X-axis gradient field $G_x$) have been phase-encoded in the respective directions, i.e., encoded by the slice gradient field Gs (the Z-axis gradient field Gs) in the slice direction and encoded by the encode gradient field Ge (e.g., the Y-axis gradient field $G_y$) in the encode direction. By repeating the above sequence the number of times corresponding to the matrix size of MR image data to be reconstructed while sequentially changing the intensity of each gradient field for each encoding operation, three-dimensional data corresponding to the above three-dimensional region can be obtained.

A practical example will be described below. If a slice count $N=32$ and a slice thickness $w=1$ mm, a slab thickness $W=32$ mm.

A presaturation selective excitation pulse PRP is applied to regions located both the sides of the region having the slab thickness $W=32$ mm in a period. With this operation, for example, both the regions are saturated to a thickness of 32 mm which is equal to the slab thickness.

Figure 16:
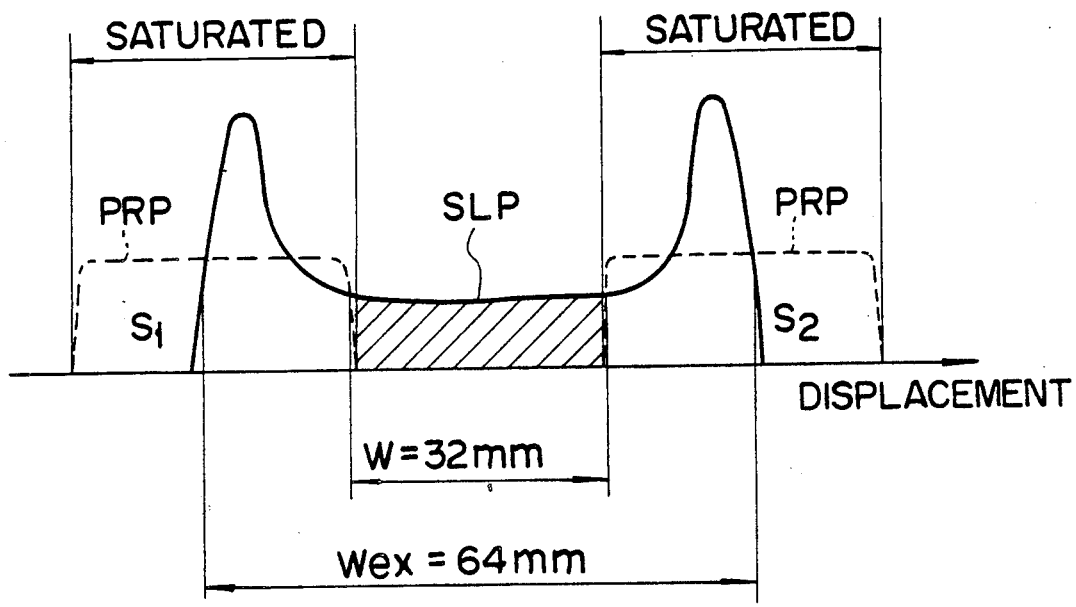
FIG. 16 is a graph showing selective excitation characteristics obtained when the present invention is applied to an FE method.

Subsequently, a slab selective excitation pulse SLP having frequency components for exciting a region having a thickness of 64 mm which is twice the thickness of both the regions is applied. This operation can be realized by reducing the intensity of the slice gradient field Gs superposed on the pulse SLP to a value ½ that of the gradient field Gs applied to the region having a thickness of 32 mm. With this operation, an MR signal is induced at only a hatched portion shown in FIG. 16 and can be acquired.

In this case, since the saturated and nonsaturated regions are not perfectly separated from each other due to the influence of the selective excitation characteristics, an effective count Nef and a slice count N cannot be set as Nef=N. In comparison with the conventional system, however, a ratio of the effective slice count Nef to the slice count N is greatly increased.

Especially, in the present invention, a remarkable effect can be obtained when a large flip angle is set with a relatively short pulse repetition time $T_R$. The present invention is more effective in a three-dimensional Fourier transform method requiring acquisition of a large amount of data. A typical case in which the present invention is especially effective is that $T_R$ is set to be about 50 msec; $T_E$, about 10 msec; and a flip angle, about 90°. Even if a flip angle is set to be about 60° to 90°, an excellent effect can be obtained.

In the above-described embodiment, a region which includes a three-dimensional region (to be imaged corresponding to an effective slice portion and is broader than the region in the slice direction is selectively excited by the method of reducing the intensity of the slice gradient field Gs without changing the width and amplitude of the slab selective excitation pulse SLP. However, instead of employing this method, the envelope waveform of the slab selective excitation pulse SLP may be compressed in the width direction and its amplitude may be increased without changing the intensity of the slice gradient field Gs. For example, in the above case, the pulse width may be halved and the amplitude is doubled without changing the intensity of the slice gradient field Gs. With this setting, the echo time TE can be shortened, and hence the scan time can be shorted.

Figure 17:
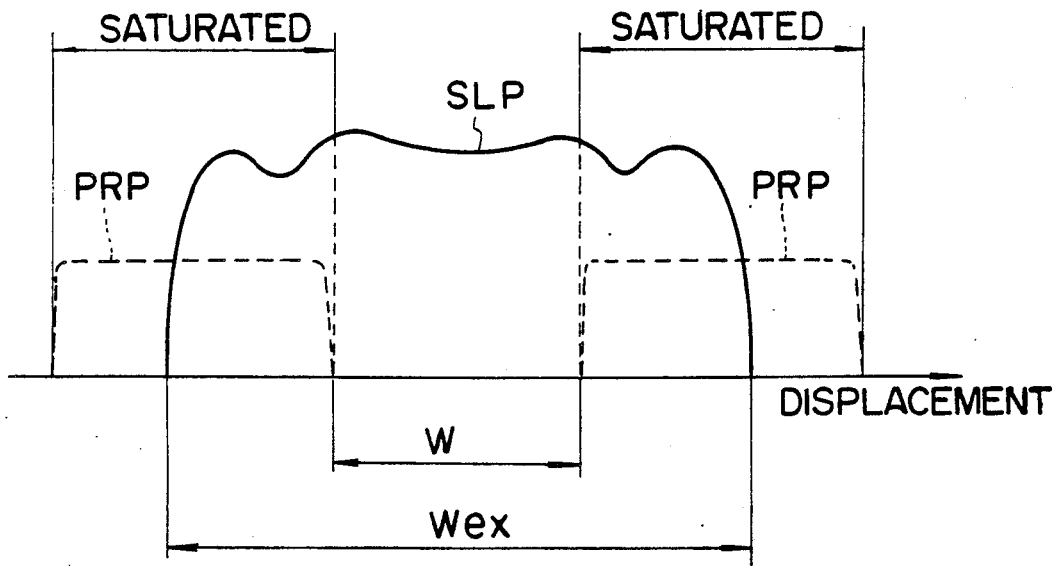
FIG. 17 is a graph showing selective excitation characteristics obtained when the present invention is applied to an SE method.

In the above-described embodiment, the presaturation processing is applied to the three-dimensional Fourier transform method including selective excitation in the sequence based on the FE method. However, the processing may be applied to the three-dimensional Fourier transform method including selective excitation in the sequence based on the SE method. FIG. 17 shows selective excitation characteristics in this case.

Various changes and modifications may be made within the spirit and scope of the invention.

Additional advantages and modifications will readily occur to those skilled in the art. Therefore, the invention in its broader aspects is not limited to the specific details, representative devices, and illustrated examples shown and described herein. Accordingly, various modifications may by without departing from the spirit or scope of the general inventive concept as defined by the appended claims and their equivalents.

What is claimed is:

1. A magnetic resonance imaging system for acquiring a magnetic resonance signal from a three-dimensional region to be imaged by executing a data acquisition pulse sequence based on a three-dimensional transform method including selective excitation, comprising:
    presaturation means for presaturating regions located on both sides of the three-dimensional region in a predetermined direction prior to execution of the data acquisition pulse sequence based on the three-dimensional Fourier transform method including selective excitation; and
    data acquisition means for selectively exciting a region which includes the three-dimensional region and is broader than the three-dimensional region in the predetermined direction after presaturation performed by said presaturation means, and executing the data acquisition pulse sequence based on the three-dimensional Fourier transform method so as to acquire the magnetic resonance signal from the three-dimensional region.

2. A system according to claim 1, wherein said data acquisition means includes means for selectively exciting the region which includes the three-dimensional region and is broader than the three-dimensional region in the predetermined direction by setting an intensity of a gradient field in the predetermined direction to be smaller than that set when only the three-dimensional region is selectively excited while setting a waveform of a selective excitation pulse to be the same as that of a selective excitation pulse used for selective excitation of only the three-dimensional region.

3. A system according to claim 1, wherein said data acquisition means includes means for selectively exciting the region which includes the three-dimensional region and is broader than the three-dimensional region in the predetermined direction by compressing an envelope waveform of a selective excitation pulse and increasing an amplitude thereof as compared with a selective excitation pulse used in selective excitation of only the three-dimensional region while setting an intensity of a gradient field in the predetermined direction to be the same as that of a gradient field used for selective excitation of only the three-dimensional region.

4. A system according to claim 1, wherein said presaturation means comprises selective excitation means for selectively exciting predetermined regions to be presaturated by applying the gradient field in the predetermined direction and a selective excitation pulse including frequency components corresponding to the predetermined regions to an object to be examined, and spoiling means for saturating the predetermined regions by applying a spoiler obtained by increasing an amplitude of a gradient field in the predetermined direction to the object immediately after the selective excitation.

5. A magnetic resonance imaging system for acquiring a magnetic resonance signal from a three-dimensional region to be imaged by executing a data acquisition pulse sequence based on a three-dimensional Fourier transform method including selective excitation, comprising:
    selective saturation means for selectively exciting predetermined regions to be presaturated by applying a first gradient field in a first direction and a selective excitation pulse including frequency components corresponding to the predetermined regions to an object to be examined, and subsequently applying a spoiler obtained by increasing an amplitude of the first gradient field to the object so as to selectively saturate regions located both sides of the three-dimensional region in the first direction;
    selective excitation means for selectively exciting a region which includes the three-dimensional region and is broader than the three-dimensional region in the first direction after saturation is performed by said selective saturation means;
    echo signal acquisition means for applying the first gradient field and a second gradient field in a second direction orthogonal to the first direction to the three-dimensional region, which is selectively excited by said selective excitation means, each of the gradient fields being applied in the form of a pulse having a polarity and an amplitude corresponding to a predetermined encode amount, applying a third gradient field in a third direction orthogonal to the first and second directions in the form of a pulse having a predetermined polarity, and subsequently applying the third gradient whose polarity is inverted, thereby acquiring a magnetic resonance echo signal phase-encoded by the first and second gradient fields; and
    control means for repeatedly operating said selective saturation means, said selective excitation means, and said echo acquisition means a predetermined number of times while sequentially changing the encode amount.

6. A system according to claim 5, wherein said selective excitation means includes means for selectively exciting the region which includes the three-dimensional region and is broader than the three-dimensional region in the first direction by setting an intensity of the first gradient field to be smaller than that set when only the three-dimensional region is selectively excited while setting a waveform of a selective excitation pulse to be the same as that of a selective excitation pulse used for selective excitation of only the three-dimensional region.

7. A system according to claim 5, wherein said data acquisition means includes means for selectively exciting the region which includes the three-dimensional region and is broader than the three-dimensional region in the first direction by compressing an envelope waveform of a selective excitation pulse and increasing an amplitude thereof as compared with a selective excitation pulse used in selective excitation of only the three-dimensional region while setting an intensity of the first gradient field to be the same as that of a gradient field used for selective excitation of only the three-dimensional region.

8. A method of acquiring a magnetic resonance signal from a three-dimensional region to be imaged by executing a data acquisition pulse sequence based on a three-dimensional Fourier transform method including selective excitation, comprising:

the presaturation step of presaturating regions located on both sides of the three-dimensional region in a predetermined direction prior to execution of the data acquisition pulse sequence based on the three-dimensional Fourier transform method including selective excitation; and the data acquisition step of selectively exciting a region which includes the three-dimensional region and is broader than the three-dimensional region in the predetermined direction after presaturation performed by said presaturation means, and executing the data acquisition pulse sequence based on the three-dimensional Fourier transform method so as to acquire the magnetic resonance signal from the three-dimensional region.

9. A method according to claim 8, wherein the data acquisition step includes the step of selectively exciting the region which includes the three-dimensional region and is broader than the three-dimensional region in the predetermined direction by setting an intensity of a gradient field in the predetermined direction to be smaller than that set when only the three-dimensional region is selectively excited while setting a waveform of a selective excitation pulse to be the same as that of a selective excitation pulse used for selective excitation of only the three-dimensional region.

10. A method according to claim 8, wherein the data acquisition step includes the step of selectively exciting the region which includes the three-dimensional region and is broader than the three-dimensional region in the predetermined direction by compressing an envelope waveform of a selective excitation pulse and increasing an amplitude thereof as compared with a selective excitation pulse used in selective excitation of only the three-dimensional region while setting an intensity of a gradient field in the predetermined direction to be the same as that of a gradient field used for selective excitation of only the three-dimensional region.

11. A method according to claim 8, wherein the presaturation step comprises the selective excitation step of selectively exciting predetermined regions to be presaturated by applying the gradient field in the predetermined direction and a selective excitation pulse including frequency components corresponding to the predetermined regions to an object to be examined, and the spoiling step of saturating the predetermined regions by applying a spoiler obtained by increasing an amplitude of a gradient field in the predetermined direction to the object immediately after the selective excitation.

12. A method of acquiring a magnetic resonance signal from a three-dimensional region to be imaged by executing a data acquisition pulse sequence based on a three-dimensional Fourier transform method including selective excitation, comprising:

the first step of selectively exciting predetermined regions to be presaturated by applying a first gradient field in a first direction and a selective excitation pulse including frequency components corresponding to the predetermined regions to an object to be examined, and subsequently applying a spoiler obtained by increasing an amplitude of the first gradient field to the object so as to selectively saturate regions located both sides of the three-dimensional region in the first direction;

the second step of selectively exciting a region which includes the three-dimensional region and is broader than the three-dimensional region in the first direction after the saturation;

the third step of applying the first gradient field and a second gradient field in a second direction orthogonal to the first direction to the three-dimensional region, which is selectively excited in the second step, each of the gradient fields being applied in the form of a pulse having a polarity and an amplitude corresponding to a predetermined encode amount, applying a third gradient field in a third direction orthogonal to the first and second directions in the form of a pulse having a predetermined polarity, and subsequently applying the third gradient whose polarity is inverted, thereby acquiring a magnetic resonance echo signal phase-encoded by the first and second gradient fields; and the fourth step of repeatedly executing the first to third steps a predetermined number of times while sequentially changing the encode amount.

13. A method according to claim 12, wherein the second step includes the step of selectively exciting the region which includes the three-dimensional region and is broader than the three-dimensional region in the first direction by setting an intensity of the first gradient field to be smaller than that set when only the three-dimensional region is selectively excited while setting a waveform of a selective excitation pulse to be the same as that of a selective excitation pulse used for selective excitation of only the three-dimensional region.

14. A method according to claim 12, wherein the second step includes the step of selectively exciting the region which includes the three-dimensional region and is broader than the three-dimensional region in the first direction by compressing an envelope waveform of a selective excitation pulse and increasing an amplitude thereof as compared with a selective excitation pulse used in selective excitation of or the three-dimensional region while setting an intensity of the first gradient field to be the same as that of a gradient field used for selective excitation of only the three-dimensional region.

* * * * *